(12) United States Patent
Afanador (10) Patent No.: US 10,901,032 B1
(45) Date of Patent: Jan. 26, 2021

(54) SYSTEM AND METHOD FOR REMOTE INTELLIGENT TROUBLESHOOTING

(71) Applicant: RAYTHEON COMPANY, Waltham, MA (US)

(72) Inventor: Jairo Abraham Afanador, Lucas, TX (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/570,901

(22) Filed: Sep. 13, 2019

(51) Int. Cl.
*G01R 31/30* (2006.01)
*G01R 31/317* (2006.01)
*G06N 5/02* (2006.01)
*G06N 20/00* (2019.01)
*G01R 31/3177* (2006.01)

(52) U.S. Cl.
CPC ... *G01R 31/31718* (2013.01); *G01R 31/3177* (2013.01); *G06N 5/02* (2013.01); *G06N 20/00* (2019.01)

(58) Field of Classification Search
None
See application file for complete search history.

(56) References Cited

U.S. PATENT DOCUMENTS

| | | | |
|---|---|---|---|
| 5,544,308 A * | 8/1996 | Giordano | G06F 11/2257 714/26 |
| 5,774,456 A * | 6/1998 | Ellebracht | H04J 3/14 370/242 |
| 6,260,160 B1 | 7/2001 | Beyda et al. | |
| 6,421,323 B1 * | 7/2002 | Nelson | H04J 3/14 370/249 |
| 6,825,846 B2 | 11/2004 | Mondal | |
| 7,020,598 B1 * | 3/2006 | Jacobson | G06F 11/2294 702/57 |
| 2006/0036390 A1 | 2/2006 | Loh et al. | |

(Continued)

FOREIGN PATENT DOCUMENTS

WO  WO 01/80573 A3  10/2001

OTHER PUBLICATIONS

Camurati, et al., "Knowledge-based systems as an aid to computer-aided repair", Microprocessors and Microsystems, IPC Business Press Ltd., vol. 13, No. 7, Sep. 1989 (5 pgs.).

(Continued)

*Primary Examiner* — Mujtaba M Chaudry
(74) *Attorney, Agent, or Firm* — Lewis Roca Rothgerber Christie LLP (57) ABSTRACT

System and method for autonomous trouble shooting of a unit under test (UUT) having a plurality of replaceable components include: a test station that stores an artificial intelligence (AI) program and a knowledge database (KDB) including acceptable test results for each test point represented by an acceptable test vector, a test probe to test the circuit card assembly; and an operator station to send commands to the test station via the communication network to teach the AI program to capture and store the acceptable test result for each test point of the UUT by the test probe, in the KDB, wherein the AI program commands the test probe to test the UUT, stores the test results in a test result vector, compares the test result vector with the stored acceptable test vector, and displays recommendation as which replaceable component in the UUT to be repaired or replaced.

19 Claims, 7 Drawing Sheets

(56) References Cited

U.S. PATENT DOCUMENTS

| | | | |
|---|---|---|---|
| 2006/0038084 A1* | 2/2006 | Fussell | B64G 1/52 |
| | | | 244/173.1 |
| 2010/0240317 A1* | 9/2010 | Giles | H04B 17/309 |
| | | | 455/67.13 |
| 2012/0233104 A1 | 9/2012 | Wang et al. | |
| 2015/0091594 A1* | 4/2015 | Hamilton | G01R 1/07 |
| | | | 324/750.01 |
| 2016/0005242 A1 | 1/2016 | Hua et al. | |
| 2019/0213115 A1* | 7/2019 | Takawale | G06F 8/30 |
| 2020/0088789 A1* | 3/2020 | Kanamaki | G01R 31/31721 |

OTHER PUBLICATIONS

International Search Report for corresponding International Application No. PCT/US2020/035701, filed Jun. 2, 2020, International Search Report dated Sep. 17, 2020 and dated Sep. 25, 2020 (5 pgs.).
Written Opinion of the International Searching Authority for corresponding International Application No. PCT/US2020/035701, filed Jun. 2, 2020, Written Opinion of the International Searching Authority dated Sep. 25, 2020 (7 pgs.).

* cited by examiner

SYSTEM AND METHOD FOR REMOTE INTELLIGENT TROUBLESHOOTING

FIELD OF THE INVENTION

The disclosed invention relates generally to troubleshooting and more specifically to a system and method for remote intelligent trouble shooting, using artificial intelligence and machine learning.

BACKGROUND

The manufacturing, production and integration of an electronic system includes the production and testing of circuit card assemblies and printed circuit boards (PCBs). Which go thought different levels of testing as the circuit card/board moves along the production process. Failures are often encountered on which engineering support is needed to resolve the issues before circuit card assemblies and PCBs can be released to a system integration step.

For example, in an in-circuit test (ICT), an electrical probe tests a populated (PCB), checking for short circuits, open circuits, resistance, capacitance, and other basic quantities which will show whether the board was correctly fabricated. The ICT is typically performed with a bed of nails type test fixture and special test equipment, or with a fixtureless in-circuit test setup. Similarly, functional testing, for example, quality assurance testing, is a method of testing that inspects the functionality of a system or an application without peering into its internal structures or workings. Functional testing typically involves six steps:
1. Identification of functions that the system is expected to perform,
2. Creation of input data based on the function's specifications,
3. Determination of output based on the function's specifications,
4. Execution of test cases,
5. Comparison of actual and expected outputs, and
6. Checking whether the system under test works as expected.

However, current processes and troubleshooting system do not allow for fully designing anywhere, producing anywhere, and integrating the circuit card assemblies and PCBs (boards) anywhere, especially where the technical knowledge needed to troubleshoot them when they fall out of the production line is far away from where the boards are being produced. The logistics to put the technical knowledge and the falling out PCBs together involves traveling of the technical knowledge, or shipping of the faulty boards and time and cost not directly associated with the troubleshooting.

A test point is a location within an electronic circuit utilized to monitor the state of the circuit or to inject test signals. During manufacturing test points are used to verify that a newly assembled device is working correctly. Any equipment that fails this testing is either discarded or sent to a rework station to attempt to repair the manufacturing defects. Also, after production and sale of the device, test points may be used at a later time to repair the device if it malfunctions, or if the device needs to be re-calibrated after having components replaced.

Typically, PCB testing of the finished products validates the performance of the PCB with a test function. Defects are exposed during the testing step and at that time technical expertise are brought into the process to correct defects and return the corrected PCBs back into the production flow. Troubleshooting defective PCBs require intimate knowledge of the failed circuit(s) in question as well as physical proximity to probe electrical points on the PCB. However, most defects tend to repeat such that a knowledge base of defects allows for less knowledgeable personnel to fix defects as the production matures.

SUMMARY

In some embodiments, the disclosed invention is a system and method for autonomous trouble shooting, using artificial intelligence and machine learning. In some embodiments, the disclosed invention is a system for autonomous trouble shooting of a circuit card assembly having a plurality of replaceable components. The system includes: a test station including: a first computer having a display, memory coupled to the computer to store an artificial intelligence (AI) program and a knowledge database (KDB), wherein the KDB includes a plurality of indexes, each index corresponding to associated test points of a unit under test (UUT), and respective acceptable test results for each test point represented by an acceptable test vector, a test probe to test the circuit card assembly as the UUT, and a network interface to communicate with a communication network. The system further includes: an operator station including a second computer and memory to send commands to the test station via the communication network to teach the AI program to capture and store the acceptable test result for each test point of the UUT by the test probe, in the KDB, wherein the AI program when executed by the first computer commands the test probe to test the UUT, stores the results in a test result vector, compares the test result vector with the stored acceptable test vector, and displays recommendation as which replaceable component in the UUT to be repaired or replaced.

In some embodiments, the disclosed invention is a method for autonomous trouble shooting of a circuit card assembly having a plurality of replaceable components. The method includes: storing an artificial intelligence (AI) program and a knowledge database (KDB) in a memory by a test station, wherein the KDB includes a plurality of indexes, each index corresponding to associated test points of the circuit card assembly identified as a unit under test (UUT), and respective acceptable test results for each test point represented by an acceptable test vector; testing the UUT by a test probe; and teaching the AI program to capture and store the acceptable test result for each test point of the UUT by the test probe, in the KDB. The AI program when executed by the first computer commands the test probe to test the UUT, stores the results in a test result vector, compares the test result vector with the stored acceptable test vector, and displays recommendation as which replaceable component in the UUT to be repaired or replaced.

In some embodiments, the disclosed invention is a non-transitory storage medium (such as RAM, ROM, hard drive and/or CD) for storing a set of instructions, the set of instructions when executed by one or more processors perform a method for autonomous trouble shooting of a circuit card assembly having a plurality of replaceable components. The method includes: storing an artificial intelligence (AI) program and a knowledge database (KDB) in a memory by a test station, wherein the KDB includes a plurality of indexes, each index corresponding to associated test points of the circuit card assembly identified as a unit under test (UUT), and respective acceptable test results for each test point represented by an acceptable test vector; testing the UUT by a test probe; and teaching the AI program to capture and store the acceptable test result for each test point of the UUT by the test probe, in the KDB. The AI program when executed by the first computer commands the test probe to test the UUT, stores the results in a test result vector, compares the test result vector with the stored acceptable test vector, and displays recommendation as which replaceable component in the UUT to be repaired or replaced.

BRIEF DESCRIPTION OF THE DRAWINGS

These and other features, aspects, and advantages of the present invention will become better understood with regard to the following description, appended claims, and accompanying drawings.

DETAILED DESCRIPTION

In some embodiments, the disclosed invention relates to the production of circuit card assemblies, where technical expertise to troubleshoot production defects resides in a different location where the production and testing is taking place. The disclosed invention provides a virtual presence of the technical expertise and thus eliminating the need for traveling or shipping of defective goods. The disclosed invention includes artificial intelligence (AI) capabilities to the testing sites such that as the production matures, troubleshooting can be performed autonomously by an autonomous system capable of providing solutions to common production defects. This way, the disclosed invention places the engineer with the needed technical knowledge in the same place as the defective boards via a broadband network. The virtual presence of the technical knowledge eliminates the need for traveling and shipping and delays associated with that activity.

In some embodiments, the disclosed invention provides the capabilities to remotely troubleshoot circuit card assemblies and PCBs (boards) in the production facility making it possible to design anywhere produce anywhere. This approach also allows for the engineering knowledge to be transferred to the test station such that this knowledge can be mined to troubleshoot the boards in future by less experienced support personnel and as the product matures autonomous troubleshooting is highly desirable for the cost benefit and the fact experts move to other products and other programs taking with them the require knowledge to support an aging product.

Figure 1:
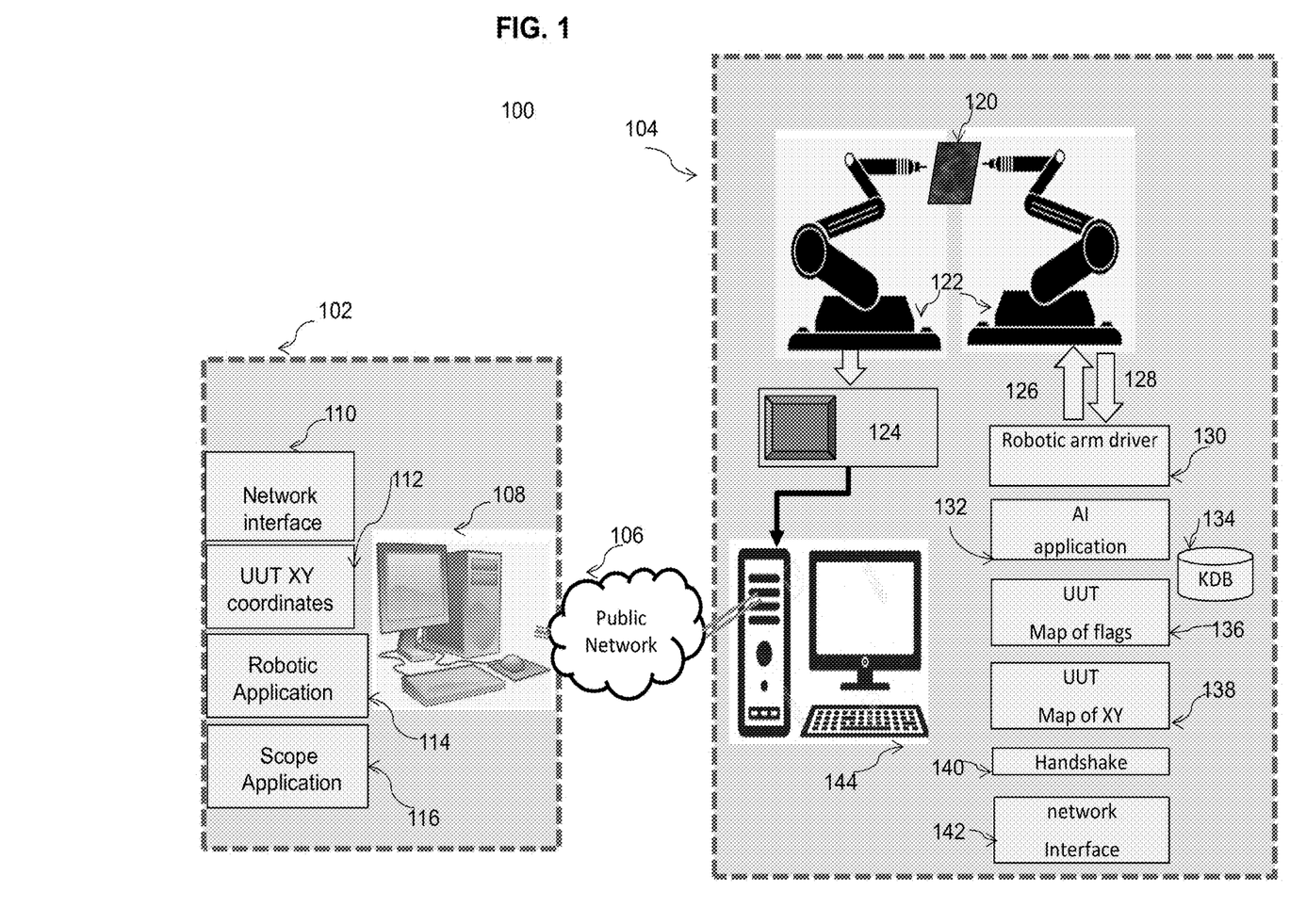
FIG. 1 is a block diagram of a trouble shooting environment, according to some embodiments of the disclosed invention.

FIG. 1 is a block diagram of a trouble shooting environment 100, according to some embodiments of the disclosed invention. As shown an operator station (OS) 102 is in (remote) communicating with a troubleshooting (or test) station (TS) 104, via a communication network 106, such as a private or public network. The OS 102 includes a computer 108 including memory and a graphical user interface, network interface circuit 110, the X, Y coordinates of the UUT 112 (e.g., stored in a memory), a robotic application 114 (e.g., stored in a memory) to control one or more robot arms 122 for probing the UUT 120, and an oscilloscope application 116 (e.g., stored in a memory) for capturing, analyzing and displaying the test results. The one or more robot arms 122 are capable of holding scope probes and capable to probe the unit under test.

The TS 104 includes the UUT 120, one or more robot arms 122, an oscilloscope 124 for capturing the test results, and software and or firmware stored in a memory for execution by a computer 144. The oscilloscope 124 is capable of capturing probed test data to be transmitted to computers 108 via network interface 142 and communication network 106. In some embodiments, the software/firmware includes a robot arm driver 130 for controlling the one or more robot arms 122, an AI application (program) 132 for performing autonomous trouble shooting using a knowledge database (KDB) 134, handshake routine 140 and network interface 142 for communicating with the OS 102. TS 104 also includes a map of test point flags 136 and a map of X, Y coordinates 138, for the UUT 120. In some embodiments, the AI application 132 includes a database of X, Y coordinates of the UUT 120 and acceptable values of the test results for each component of the UUT 102. In some embodiments, this data base of X, Y coordinates may be part of the KDB 134. The software/firmware sends control signal 126 to the robot arm 122 and the UUT 120, and receives position feedback 128 from the UUT 120.

A test point is defined by X, Y coordinates and thus probing the electrical activity on, for example, pin 5 of a component U34 corresponds to X, Y coordinates (for example, 534.25 mm on the X axis and 748.23 mm on the Y axis on side A of the UUT 120). Consequently, a control command 126 to probe U34, pin 5 includes the X, Y coordinates (534.25, 748.2) and the position feedback data 128 contains the actual position of the test probe such that a closed control loop guarantees the position (534.25, 748.2), regardless of external influence such as vibration at the station, etc. In other words the position feedback data 128 would include X, Y coordinates (X+Δx, Y+Δy) and a control loop makes correction to make Δ equal to zero.

In some embodiments, the disclosed invention troubleshoots UUT 120 autonomously and with no interaction with any operator, and is capable of offering troubleshooting recommendation based on the data stored in KDB 134. KDB 134 captures valid results of data points defined by X, Y coordinates on UUT 120. Typically, these X, Y coordinates 112 are already available in a file or database and are utilized during the manufacturing the bare board and the placement of the components on the bare board.

In a learning mode or troubleshooting assistance mode, the disclosed invention troubleshoots UUT 120 using troubleshooting station 104 and probes electronic circuits in the UUT 120 by the robot arm 122 as commanded by OS 102 and following the X, Y coordinates of test points. OS 102 sends probing commands to TS 104 via communication network 106, as commanded by an operator using computer 108. OS 102 also displays the results of the probing on a display of computer 108, which includes a database of X, Y coordinates and expected electrical outcome at each coordinate. The results of the probing is captured by oscilloscope 124, transmitted through the communication network 106, analyzed by oscilloscope application 116, before they are displayed.

Figure 2:
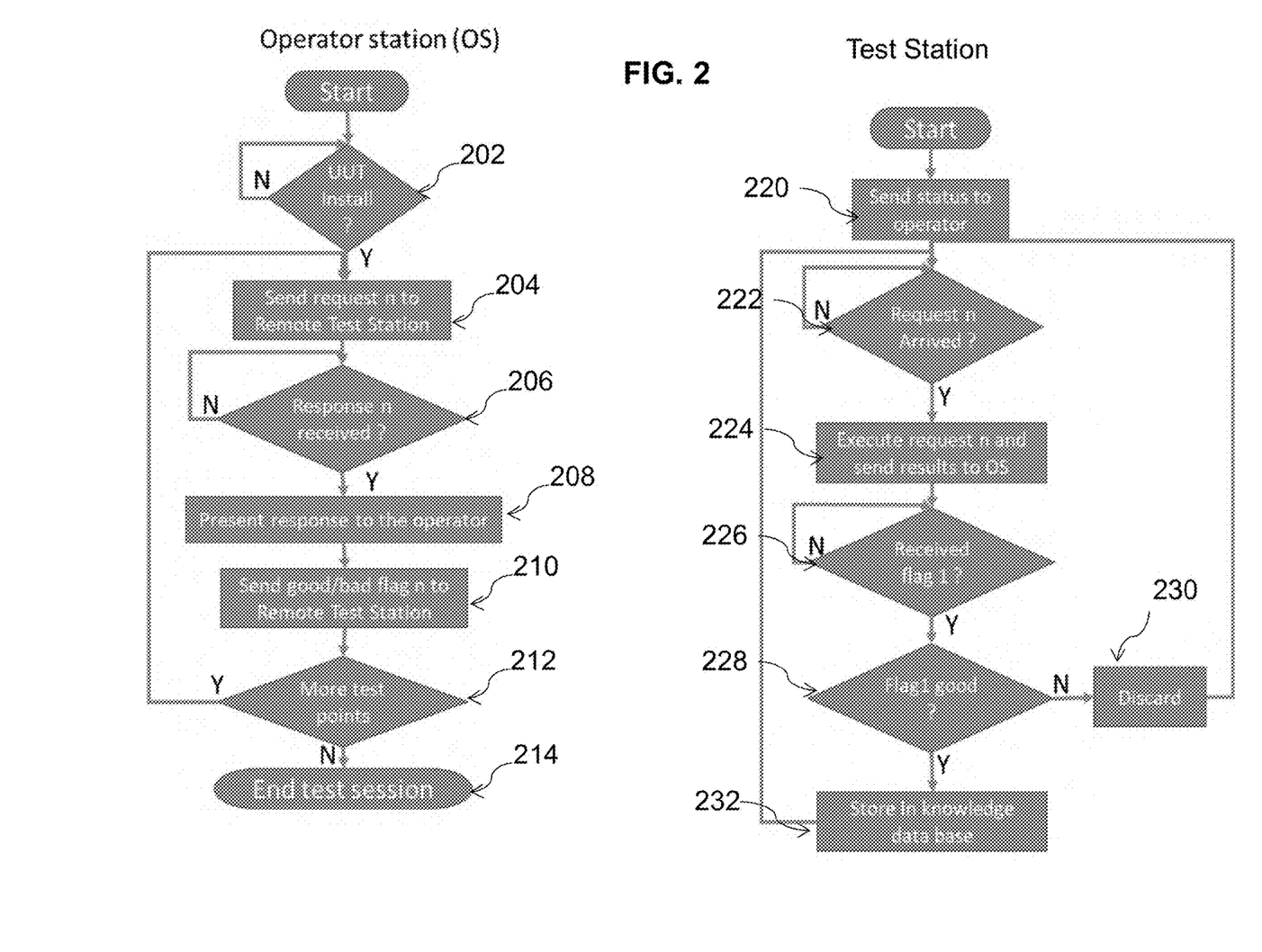
FIG. 2 is an exemplary process flow on an operator station and a test station for a learning mode, according to some embodiments of the disclosed invention.

FIG. 2 is an exemplary process flow on an operator station and a test station for a learning mode, according to some embodiments of the disclosed invention. In these embodiments, the disclosed invention includes a supervised learning process to capture and store acceptable results of the probing at each test point in KDB (e.g., 134 in FIG. 1), such that acceptable outcome at each test point can be determined. Once the acceptable or unacceptable state at a test point is determined, recommendations to make test points acceptable are generated to assist with the troubleshooting of the UUT 120. In these embodiments, the training process entails having an expert probe testing a UUT 120 via the robot arm 122 and the oscilloscope 124. As the operator probes the data base of (X,Y) coordinates (e.g., 138) and the acceptable values are created and stored in the KDB 134. When defects are found, deviations from the acceptable value are identified that correlates with a particular component in the UUT and optionally, a weight is associated to each vector.

For example, at the end of the testing stage when all test points have been acquired, the test results can be seen as a vector space defined as $(V_1, V_2, V_3, V_4, \ldots V_n)$, where $V_n$ is the result of each test point. If there is an UUT, on which there are eight components, U1 through U8, and 5 test points, $TP_1, TP_2, TP_3, TP_4$ and $TP_5$, the vector (for each component) at the end of all the above-mentioned tests would be $(V_1, V_2, V_3, V_4, V_5)$. Therefore, each test is associated with each variable of the test vector. Accordingly, for the above example with five test point, the test vector could be (1,1,0,0,1), if the UUT passes test points 1, 2 and 3. Each component will be affected by each test point differently and thus the optional weight associated with each vector may vary. As each vector is applied to each component U1 through U8, different weight is assigned to each component, for instance, $V_1$ will affect U1 by a weight of $W_{11}$, but will affect U2 by a different weight $W_{12}$. The learning process then learns the weights for each vector variable.

As shown in block 220, the test station 104 sends a status to the OS 102, for example, when and whether the UUT 120 is installed on a test platform and is ready for testing. Once the UUT is installed on the test station (block 202), the OS sends a request for testing (e.g., request n) to the test station (block 204).

In some embodiments, the request for testing is a data packet that contains a payload configuration for the oscilloscope to capture the test point value information such as: requester id, time stamp, time scale used, voltage scale used, trigger level, trigger mode, synchronization probe used, synchronization coordinates, probe used, testing point coordinates. For instance, a request to probe U34 pin 5 may have fields as those illustrated in Table 1 below.

TABLE 1

| Field # | Description |
| --- | --- |
| 1 | Start of request marker and number of bytes in this request |
| 2 | Employee number: NNNNNN |
| 3 | Time stamp: year/month/day/hour/minute |
| 4 | Time scale: 100 ns per division |
| 5 | Voltage scale: 2 V per division |

TABLE 1-continued

| Field # | Description |
| --- | --- |
| 6 | Test probe used for trigger: Channel A |
| 7 | Trigger point: U34 pin 2 (XY coordinates of the trigger point) |
| 8 | Trigger edge: falling edge |
| 9 | Trigger level: 2 V |
| 10 | Test point 1 on Channel B: U34 pin 5 (XY coordinates of the test point) |
| 11 | If more than one test point is needed Test point 2 on channel C: U34 pin 6 (XY coordinates) |
| 12 | CRC check. Last byte on this request |

Referring back to FIG. 2, the test station 104 waits until the request arrives in block 222. Once the request arrives, the test station executes the request by testing the relevant portions of the UUT 120 and send the test results back to OS 102, in block 224. The OS then waits until a response to the request is received from the test station, in block 206. Once a response is received, the OS presents the response to the operator in block 208, for example via the computer 108 in FIG. 1. In some embodiments, the response from the test station is a graphic showing all the data captured at the test point, for example, a typical oscilloscope output displays the signal voltages, timing, frequency, and the like.

In block 210, the OS 120 then sends good/bad flags to the test station 104. In some embodiments, once the test point results are available to the operator, the operator may choose to:

create a reference value to be stored in the KDB,
mark it as good to be used as a vector variable value for this test point ("good flag"),
mark it as bad to be used as a vector variable value for this test point ("bad flag"), and/or
may choose to do nothing with it.

To accomplish this, the OS102 sends a packet to the test station requesting it to store the flags (if any) in the KDB as an acceptable response as well as the acceptable deviation to use it as a vector variable value to be used by the AI application 132. For instance, an acceptable value for TP1 (test point 1) could be 5V pick-to-pick and the acceptable deviation could be plus or minus 4%. As a result, when determining whether a TP1 is passing or failing the test, any value between 4.8V and 5.2V pick-to-pick is declared as passing the test. In some embodiments, the request includes the fields shown in Table 2 below.

TABLE 2

| Field # | Description |
| --- | --- |
| 1 | Start of request marker and number of bytes in this request |
| 2 | Employee number: NNNNNN |
| 3 | Time stamp: year/month/day/hour/minute |
| 4 | Type of request: Keep as reference, keep as good flag, keep as bad flag |
| 5 | Acceptable deviation: +/− 4% |
| 6 | CRC check. Last byte on this request |

The test station 104 then waits to receive the flags, in block 226. Every request includes one flag or no flag. If the received flag is a bad flag, which is determined by the test station 104 in block 228, the test station discards it, in block 230. If the received flag is a good flag, the test station stores it in the KDB 134, in block 232. The OS 102 then checks to find whether there are more test points to be processed in block 212 and ends the test session in block 214, if there are no more test points to process. If there are more test points to process, the process returns to block 204 and repeats the above-mentioned processing for the new test point, as explained above.

In some embodiments, in the leaning mode, the process creates the KDB with the acceptable electrical behavior for each test point. Test point test results describe the electrical behavior of the test point and may include one or more of voltage values, time scale, frequency, duty cycle, and/or any electrical characteristic relevant to describe the behavior of the UUT. When the operator sends a request to test a given point, the test station responds as explained above and waits for the operator to send a good flag before the test point values are stored in the KDB. If the response from the operator is a bad flag, the test point values are not stored in the KDB and thus will not be used for future troubleshooting assistance or autonomous functions.

In some embodiments, the KDB include a plurality of indexes corresponding to associated test points and their test results. Each index is a test point number, which is define by X, Y coordinates of the UUT, and the test results are the properties describing electrical behavior of the test point. For example, a response to a request for "test point n" results on a response as "Rms voltage is 121V, voltage pick to pick is 333V, maximum voltage 166V, frequency 60 hertz, minimum voltage −166 vols." In this case, the test station waits for the operator to instruct weather to keep this test point values or discard it.

For the purpose of this example, if the operator decides that the test result is a good one and worth storing it as a reference value in the KDB 134, the operator send a good flag response to the test station. Upon receiving the good flag, the test station stores the test result entry "test point n", which is the index to the values describing the electrical behavior of the test point, in the KDB. Once in the KDB, the test point n can be recalled.

Figure 3:
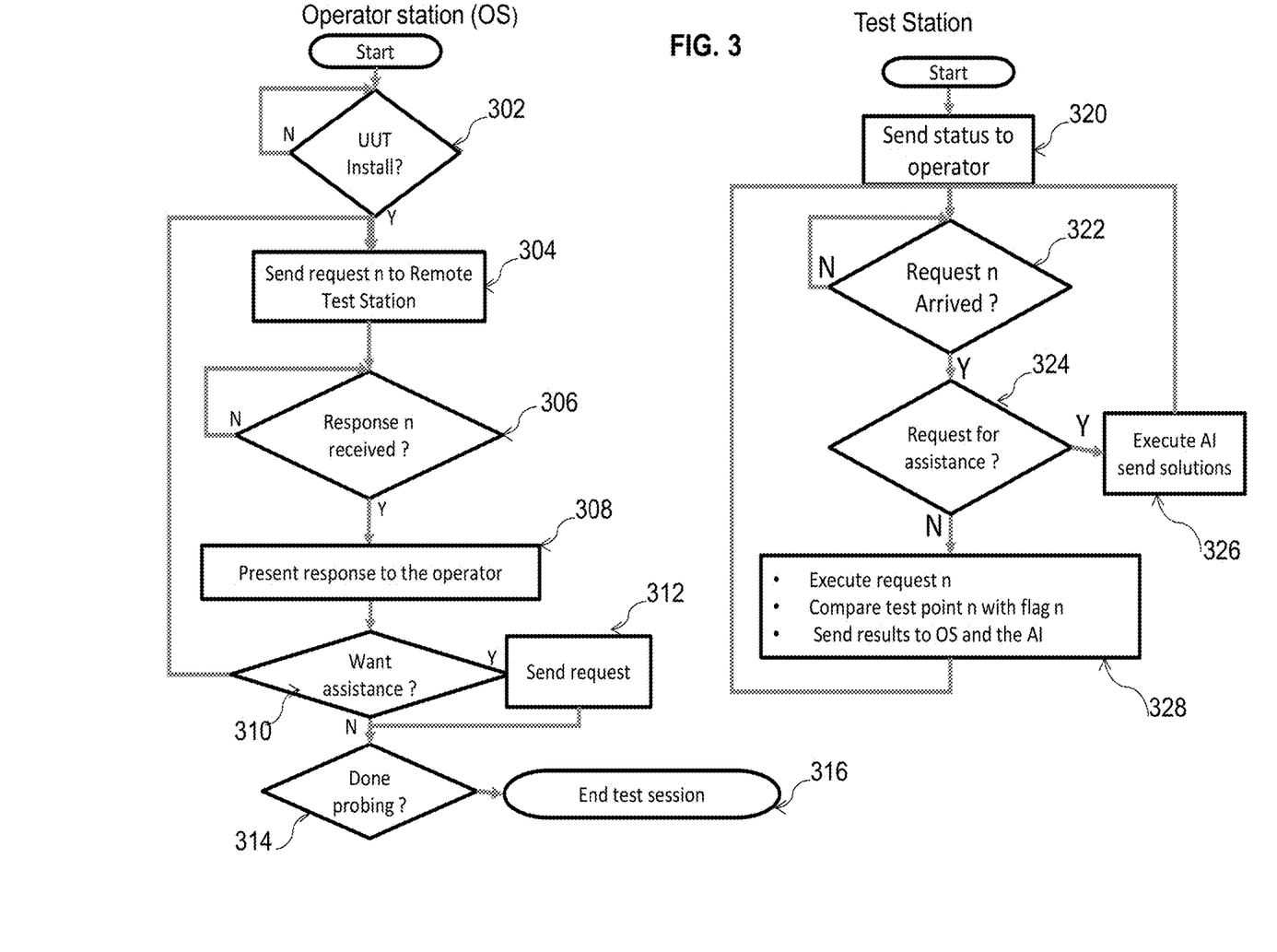
FIG. 3 is an exemplary process flow on an operator station and a test station for a troubleshooting assistance mode, according to some embodiments of the disclosed invention.
Figure 6A:
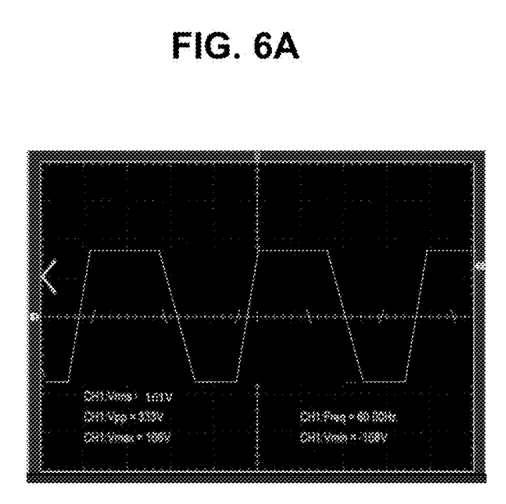
FIG. 6A show an operator's request and FIG. 6B depicts a response, according to some embodiments of the disclosed invention.
Figure 6B:
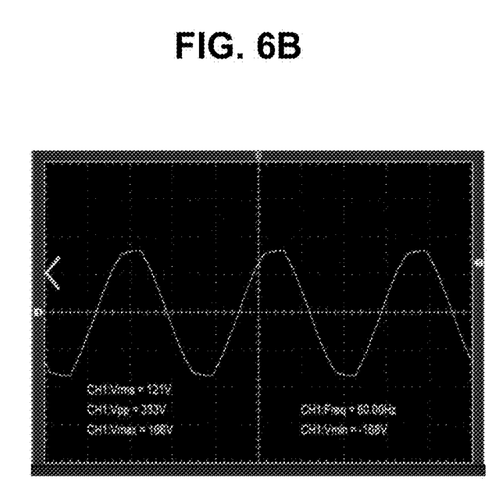

FIG. 3 is an exemplary process flow on an operator station and a test station for a troubleshooting assistance mode, according to some embodiments of the disclosed invention. In some embodiments, the disclose invention assists the operator by making suggestions or answering questions for the troubleshooting of the UUT in this mode. The troubleshooting assistance process may entail the robotic arm probing X, Y coordinates autonomously per (X, Y) database and the artificial intelligence application comparing results with expected values stored in the database and presenting the results, as solutions to proceed with repair or replacement of a particular component in the UUT. As an example of troubleshooting assistance mode, if the operator requests "test point n" from the KDB (shown in FIG. 6A), a response is received similar to what is depicted in FIG. 6B.

Similar to FIG. 2, in block 320, the test station sends a status to the OS, for example, when and whether the UUT is installed on a test platform and is ready for testing. Once the UUT is installed on the test station (block 302), the OS sends a request for testing (e.g., request n) to the test station (block 304). The test station waits until the request arrives in block 322. Once the request arrives, the test station checks to determine whether the request is for assistance, in block 324. If the request is for assisting the operator, the test station executes an AI program and sends the troubleshooting solution (as a result of AI execution) to the OS, in block 326. The AI routine for troubleshooting is further described below with respect to FIG. 5.

For example, the request for assistance may take the form of "show me what this test point supposed to look like." The test station then responds as explained above with the data stored in the KDB, if the request for assistance is in the form of how to fix the discrepancy at this time. The test station assumes all other test points are good and runs the AI application 132 with the faults found at this point. For instance, in the case of a system with ten testing points, assume that at test point 5 the operator has three test points that match the values in the KDB and two test points that do not match, there are still five more test points, before a full test vector can be defines for the UUT. In other words, the test vector at this point may look like (1,1,0, 0,1, ?, ?, ?, ?, ?). If the operator requests assistance to fix discrepancies at this stage of the testing, the test station assumes the other remaining five test points that are not tested are good and executes the AI application 132 with a test vector of the form (1,1,0, 0,1, 1?, 1?,1?, 1?, 1 ?), where "1 ?" is the assumed successful test.

In block 328, when the request is not for assistance but a request for testing, a test point, the test station executes the request, compares the test results with the values stored in the KDB 134. If the values found are within the acceptable values, the test station marks flag n associated to this test point as a good flag. For example, if the UUT has ten test points, the test vector for this test unit would be $(V_1, V_2, V_3, V_4, V_5, V_6, V_7, V_8, V_9, V_{10})$. When the operator sends the request to test "test point 1," the test station executes the request and compares the test result values for test point 1 with those stored in the KDB for test point 1.

If the comparison is a good (acceptable) flag 1, $V_1$ is given the value of 0 (zero) and the test vector would be $(0, V_2, V_3, V_4, V_5, V_6, V_7, V_8, V_9, V_{10})$. As more test points are tested, the test vector starts filling up with real flag values of passing or failing the tests, until all flags are defined for a final test vector of the form (0, 0, 0, 0, 0, 0, 0, 0, 0, 0) for a UUT with no faults. Similarly, a test vector for a UUT with faults on tests 2, 5 and 7, would be (0, 1, 0, 0, 1, 0, 1, 0, 0, 0). Upon completion of probing all test point, the AI application is executed with the test vector created for current test iteration.

In block 306, the OS 102 then waits until a response to the request (block 326 or 328) is received from the test station. Once a response is received, the OS presents the response to the operator in block 308, for example via the computer 108 in FIG. 1. If the operator needs assistance (block 310), the OS then sends a request for assistance in block 312. The test station then responds to the request for assistance in block 326, as explained above. When there are no more requests for assistance, the OS checks to determine whether the probe testing is completed in block 314 and ends the session, as shown in block 316. The request in block 312 is different from the request in block 304, at least for the field called "type of request." For example, the probe request has different identification value than the request for assistance and depending on the type of request other fields could become irrelevant.

Figure 4:
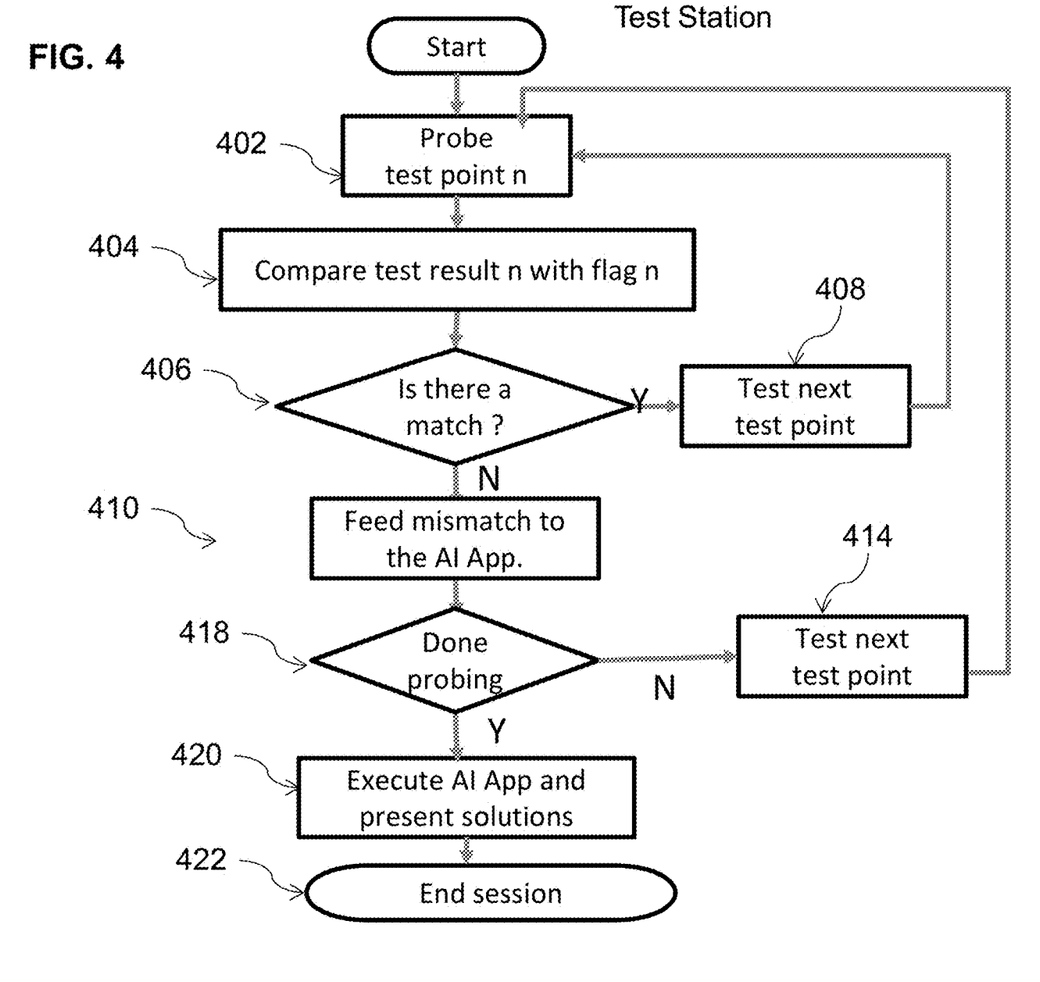
FIG. 4 is an exemplary process flow for an autonomous testing mode, according to some embodiments of the disclosed invention.

FIG. 4 is an exemplary process flow for an autonomous testing mode, according to some embodiments of the disclosed invention. In some embodiments, the process is executed only on the test station and the OS is not involved in the process, as depicted in FIG. 4. In block 402, the robot arms 122 are commanded to probe test point n of the UUT 120, by the AI application 132. The result of testing the test point n is then compared with flag n that is associated with test results of test point n, in block 404. When there is a match (block 406), meaning that the test result matches the expected value of test point n that is stored in the memory (for example, the memory of computer 144), the robot arms 122 are commanded to probe next test point (block 408) and probe test point n+1 of the UUT.

Figure 7:
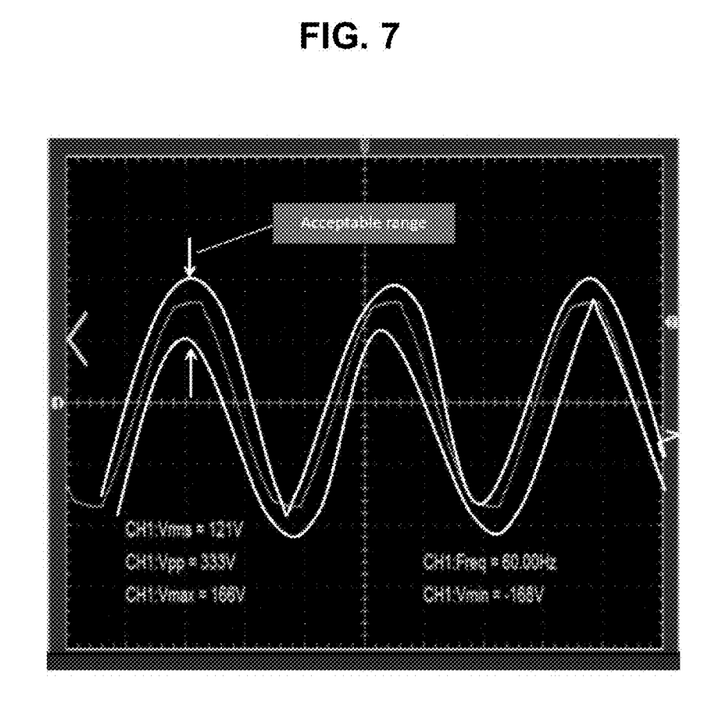
FIG. 7 shows acceptable value ranges for a test point, according to some embodiments of the disclosed invention.

However, when there is not a match (block 406), meaning that the test result does not match the expected value of test point n that is stored in the memory, the mismatch is feed to the AI application 132. In some embodiments, the KDB holds the acceptable values for each test point in the form of acceptable range values for any test point as shown in FIG. 7.

When the probe testing is completed (block 418), the test station executes the AI application 132 that includes all the mismatches related to the current test session for testing the UUT, presents solution to the OS as shown in block 420, and ends the test session in block 422. When the probe testing is not completed (block 418), the test station causes the robot arms to probe next test point (block 418) and probe test point n+1 of the UUT, in block 402.

Figure 5:
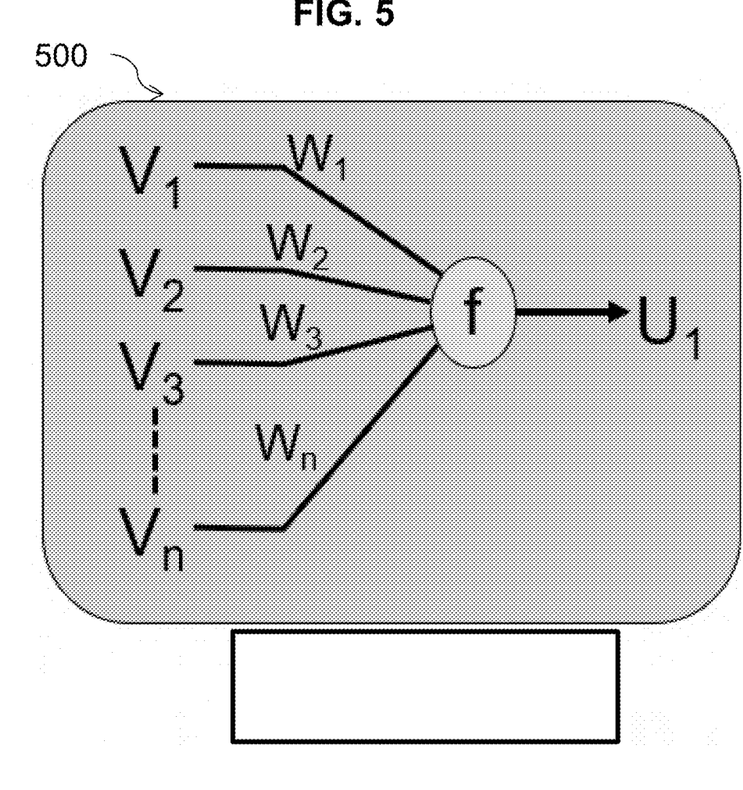
FIG. 5 is an exemplary neuro circuit for an artificial intelligent application, according to some embodiments of the disclosed invention.

Any test point with values outside of the acceptable range are considered a mismatch and the test point is flagged as a failed test point (bad flag). After all test points are tested, the UUT is defined by a test vector of $(V_1, V_2, V_3, V_4, \ldots V_n)$, where n is the number of tests for a complete test iteration. The AI application 132 then uses the mismatch values to populate the test vector with passing and failing values. Once the test vector is fully defined (populated), the function of FIG. 5 is executed for every replaceable component to identify which one(s) needs to be replaced. For instance in the case of ten tests, if the test vector is (0, 1, 0, 0, 1, 0, 1, 0, 0, 0) indicating failure on tests 2, 5 and 7, the following will take place if the UUT is made of five potential replaceable components labeled U1, U2, U3, U4, and U5.

$U1=V1 \times W11+V2 \times W12+V3 \times W13+V4 \times W14+V5 \times W15+V6 \times W16+V7 \times W17+V8 \times W18+V9 \times W19+V10 \times W110,$ $U2=V1 \times W21+V2 \times W22+V3 \times W23+V4 \times W24+V5 \times W25+V6 \times W26+V7 \times W27+V8 \times W28+V9 \times W29+V10 \times W210,$ $U3=V1 \times W31+V2 \times W32+V3 \times W33+V4 \times W34+V5 \times W35+V6 \times W36+V7 \times W37+V8 \times W38+V9 \times W39+V10 \times W310,$ $U4=V1 \times W41+V2 \times W42+V3 \times W43+V4 \times W44+V5 \times W45+V6 \times W46+V7 \times W47+V8 \times W48+V9 \times W49+V10 \times W410,$ $U5=V1 \times W51+V2 \times W52+V3 \times W53+V4 \times W54+V5 \times W55+V6 \times W56+V7 \times W57+V8 \times W58+V9 \times W59+V10 \times W510,$ which leads to:

$U1=0+V2 \times W12+0+0+V5 \times W15+0+V7 \times W17+0+0+0$ $U2=0+V2 \times W22+0+0+V5 \times W25+0+V7 \times W27+0+0+0$ $U3=0+V_2 \times W_{32}+0+0+V_5 \times W_{35}+0+V_7 \times W_{37}+0+0+0$
$U4=0+V_2 \times W_{42}+0+0+V_5 \times W_{45}+0+V_7 \times W_{47}+0+0+0$
$U5=0+V_2 \times W_{52}+0+0+V_5 \times W_{55}+0+V_7 \times W_{57}+0+0+0$ Assuming the weighs as calculated during the training stage are:

W12=0.1, W15=0.1, W17=0.1, W22=0.2, W25=0.1, W27=0.2, W32=0.5, W35=0.5, W37=0.5, W42=0.1, W45=0.1, W47=0.1, W52=0.1, W55=0.1, W57=0.1, the solution for U1 though U5 will be:

$U1=0+0.1+0+0+0.1+0+0.1+0+0+0=0.3$ $U2=0+0.2+0+0+0.1+0+0.2+0+0+0=0.5$ $U3=0+0.5+0+0+0.5+0+0.5+0+0+0=1.5$ $U4=0+0.1+0+0+0.1+0+0.1+0+0+0=0.3$ $U5=0+0.1+0+0+0.1+0+0.1+0+0+0=0.3$

As a result, the AI application recommends U3 as the candidate component for replacement.

FIG. 5 is an exemplary neuro circuit 500 for an artificial intelligent application, according to some embodiments of the disclosed invention. In some embodiments, the disclosed invention learns to perform troubleshooting by considering examples in the learning mode, for instance, the learning mode described with respect to FIG. 2 and automatically generates and implements troubleshooting solution from the learning test result examples that it processes. In some embodiments, each connection (artificial neuron) of the neuro circuit 500 can transmit a signal to another connection. An artificial neuron that receives a signal can process it and then signal additional artificial neurons connected to it. As explained above with respect to FIG. 2, the process of learning is for the test station to allocate the right weight to every test result, so that the AI application can then utilize the weighted test results to suggest and/or implement troubleshooting solutions.

In some embodiments, the AI application 132 includes a (X, Y) data base of XY coordinates and the acceptable values of the test results, as illustrated in Table 1 below.

TABLE 1

| Test point # | X coordinate | Y coordinate | Acceptable Value |
|---|---|---|---|
| 1 | $X_1$ | $Y_1$ | $V_1$ |
| 2 | $X_2$ | $Y_2$ | $V_2$ |
| 3 | $X_3$ | $Y_3$ | $V_3$ |
| n | $X_n$ | $Y_n$ | $V_n$ |
| □ | □ | □ | □ |
| □ | □ | □ | □ |
| N | XN | YN | VN |

Referring back to FIG. 5, "U" is the electrical component (of the UUT) under scrutiny for repair or replacement. The learning mode creates a historical data of solutions that can be mined later by computing success rate of success replacing components given a combination of failures. Any test exercises multiple replaceable components. For example component U is exercised by tests values V1 though Vn, and each test has a different probability of exposing or eliminating component U. As a result, every test has an associated weight Wn.

In some embodiments of the learning mode, the test station stores the weight each test allocates to each replaceable component, based on historical data, for example, after one hundred UUTs have been tested. In the case of the above example, if 50% of the time, failed test 2 was fixed by replacing the component U3, then the weight $W_{32}$ will have a 0.5 value. Likewise, if 10% of the time failed test 2 was fixed by replacing component U2, the weight $W_{22}$ will have a 0.1 value. However, if test 10 failed and 90% of the time it was fixed by replacing component U5, then weight $W_{310}$ could have a "−1.50" value and weight $W_{510}$ could have a value of 1.50 to eliminate U3 in favor of U5

The OS 102 runs the robotic application 114 to control the robotic arms and then displays the data collected by the oscilloscope 124. The OS also interacts with the AI application 132 to train it. As described above, the AI application 132 has a learning mode and a troubleshooting assistance mode. During learning, the artificial intelligence application fills the database of X, Y coordinates (e.g., 138) with acceptable values Vn. During the troubleshooting assistance mode, the robotic arms probe X, Y coordinates autonomously based on the data in the (X, Y) database and the AI application compares results with expected values stored in the KDB 134 and presents the results, as solutions to proceed with repair or replacement of a particular component in the UUT.

The AI application 132 then performs $\Sigma$ (Vn*Wn), by the neuro circuit 500 in FIG. 5, to sort candidates for replacement.

For example, for a UUT with ten tests, the test vector is $(V_1, V_2, V_3, V_4, V_5, V_5, V_5, V_8, V_9, V_{10})$. However, if the test vector is (0, 1, 0, 0, 1, 0, 1, 0, 0, 0) indicating failure on test 2, 5 and 7, the following will take place if the unit under test is made of five potential replaceable (or repairable) units labeled U1, U2, U3, U4, and U5.

$U1=V1 \times W11+V2 \times W12+V3 \times W13+V4 \times W14+V5 \times W15+V6 \times W16+V7 \times W17+V8 \times W18+V9 \times W19+V10 \times W110$ $U2=V1 \times W21+V2 \times W22+V3 \times W23+V4 \times W24+V5 \times W25+V6 \times W26+V7 \times W27+V8 \times W28+V9 \times W29+V10 \times W210$ $U3=V1 \times W31+V2 \times W32+V3 \times W33+V4 \times W34+V5 \times W35+V6 \times W36+V7 \times W37+V8 \times W38+V9 \times W39+V10 \times W310$ $U4=V1 \times W41+V2 \times W42+V3 \times W43+V4 \times W44+V5 \times W45+V6 \times W46+V7 \times W47+V8 \times W48+V9 \times W49+V10 \times W410$ $U5=V1 \times W51+V2 \times W52+V3 \times W53+V4 \times W54+V5 \times W55+V6 \times W56+V7 \times W57+V_8 \times W_{58}+V_9 \times W_{59}+V_{10} \times W_{510}$, which leads to:

$U1=0+V2 \times W12+0+0+V5 \times W15+0+V7 \times W17+0+0+0$ $U2=0+V2 \times W22+0+0+V5 \times W25+0+V7 \times W27+0+0+0$ $U3=0+V_2 \times W_{32}+0+0+V_5 \times W_{35}+0+V_7 \times W_{37}+0+0+0$
$U4=0+V_2 \times W_{42}+0+0+V_5 \times W_{45}+0+V_7 \times W_{47}+0+0+0$
$U5=0+V_2 \times W_{82}+0+0+V_8 \times W_{88}+0+V_7 \times W_{87}+0+0+0$ Let's assume the weighs, as calculated during the training stage, are:

W12=0.1, W15=0.1, W17=0.1, W22=0.2, W25=0.1, W27=0.2, W32=0.5, W35=0.5, W37=0.5, W42=0.1, W45=0.1, W47=0.1, W52=0.1, W55=0.1, W57=0.1,

The solution for U1 though U5 will then be $U1=0+0.1+0+0+0.1+0+0.1+0+0+0=0.3$ $U2=0+0.2+0+0+0.1+0+0.2+0+0+0=0.5$ $U3=0+0.5+0+0+0.5+0+0.5+0+0+0=1.5$ $U4=0+0.1+0+0+0.1+0+0.1+0+0+0=0.3$ $U5=0+0.1+0+0+0.1+0+0.1+0+0+0=0.3$ If the solution for U3 is greater than 1, U3 is recommended as the candidate component for replacement or repair. If the test vector was (0, 1, 0, 0, 1, 0, 1, 0, 0, 1) and the weight $W_{110}=-1$, $W_{210}=-1$, $W_{310}=-1$, $W_{410}=-1$, $W_{510}=1.5$ then:

$U1=0+0.1+0+0+0.1+0+0.1+0+0-1=-0.7$ $U2=0+0.2+0+0+0.1+0+0.2+0+0-1=-0.5$ $U3=0+0.5+0+0+0.5+0+0.5+0+0-1=0.5$ $U4=0+0.1+0+0+0.1+0+0.1+0+0-1=-0.7$ $U5=0+0.1+0+0+0.1+0+0.1+0+0+1.5=1.8$

But, if the solution for U5 is greater than 1, U5 is recommended as the candidate component for replacement or repair instead of U3. In some embodiments, when $\Sigma$ (Vn*Wn)>1, component "$y_n$" is a candidate for replacement or repair. The weight allocated to every test may be the probability of successful rework based on the historical data collected during the learning period, as explained above.

It will be recognized by those skilled in the art that various modifications may be made to the illustrated and other embodiments of the invention described above, without departing from the broad inventive scope thereof. It will be understood therefore that the invention is not limited to the particular embodiments or arrangements disclosed, but is rather intended to cover any changes, adaptations or modifications which are within the scope and spirit of the invention as defined by the appended claims and drawings.

The invention claimed is:

1. A system for autonomous trouble shooting of a circuit card assembly having a plurality of replaceable components comprising:
    a test station including:
        a test probe to test the circuit card assembly as a unit under test (UUT), and
        a first computer having a display,
        memory coupled to the computer to store an artificial intelligence (AI) program and a knowledge database (KDB), wherein the KDB includes a plurality of indexes, each index corresponding to associated test points of the UUT, and respective acceptable test results for each test point represented by an acceptable test vector, and
    a network interface to communicate with a communication network; and
    an operator station including a second computer and memory to send commands to the test station via the communication network to teach the AI program to capture and store the acceptable test result for each test point of the UUT by the test probe, in the KDB, wherein
    the AI program when executed by the first computer commands the test probe to test the UUT, stores the results in a test result vector, compares the test result vector with the stored acceptable test vector, and displays recommendation as which replaceable component in the UUT to be repaired or replaced.

2. The system of claim 1, wherein each index includes a test point number defined by X, Y coordinates of the UUT, and the test results describe electrical behavior of each test point.

3. The system of claim 1, wherein each test result vector includes an entry for each test point indicating whether the UUT passed or failed a respective test point.

4. The system of claim 1, wherein each entry in the test result vector is allocated a weight based on historical data.

5. The system of claim 4, wherein the weight allocated to each entry in the test result vector is a probability of successful rework based on the historical data collected during a learning period of the AI program.

6. The system of claim 1, wherein the test station further comprises an oscilloscope to capture the test results.

7. The system of claim 6, wherein the AI program commands the test probe to test the UUT using a request data packet that contains a payload configuration for the oscilloscope to capture test result information, wherein the test result information includes one or more of requester id, time stamp, time scale used, voltage scale used, trigger level, trigger mode, probe used and test point coordinates.

8. The system of claim 1, wherein the AI program further assists a user by making suggestions or answering questions for the troubleshooting of the UUT, when in a troubleshooting assistance mode.

9. A method for autonomous trouble shooting of a circuit card assembly having a plurality of replaceable components, the method comprising:
storing an artificial intelligence (AI) program and a knowledge database (KDB) in a memory by a test station, wherein the KDB includes a plurality of indexes, each index corresponding to associated test points of the circuit card assembly identified as a unit under test (UUT), and respective acceptable test results for each test point represented by an acceptable test vector;
testing the UUT by a test probe; and
teaching the AI program to capture and store the acceptable test result for each test point of the UUT by the test probe, in the KDB, wherein the AI program when executed by the first computer commands the test probe to test the UUT, stores the results in a test result vector, compares the test result vector with the stored acceptable test vector, and displays recommendation as which replaceable component in the UUT to be repaired or replaced.

10. The method of claim 9, wherein each index includes a test point number defined by X, Y coordinates of the UUT, and the test results describe electrical behavior of each test point.

11. The method of claim 9, wherein each test result vector includes an entry for each test point indicating whether the UUT passed or failed a respective test point.

12. The method of claim 9, wherein each entry in the test result vector is allocated a weight based on historical data.

13. The method of claim 12, wherein the weight allocated to each entry in the test result vector is a probability of successful rework based on the historical data collected during a learning period of the AI program.

14. The method of claim 9, wherein the AI program commands the test probe to test the UUT using a request data packet that contains a payload configuration for capturing test result information, wherein the test result information includes one or more of requester id, time stamp, time scale used, voltage scale used, trigger level, trigger mode, probe used and test point coordinates.

15. The method of claim 9, wherein the AI program further assists a user by making suggestions or answering questions for the troubleshooting of the UUT, when in a troubleshooting assistance mode.

16. A non-transitory storage medium for storing a set of instructions, the set of instructions when executed by one or more processors perform a method for autonomous trouble shooting of a circuit card assembly having a plurality of replaceable components, the method comprising:
storing an artificial intelligence (AI) program and a knowledge database (KDB) in a memory by a test station, wherein the KDB includes a plurality of indexes, each index corresponding to associated test points of the circuit card assembly identified as a unit under test (UUT), and respective acceptable test results for each test point represented by an acceptable test vector;
testing the UUT by a test probe; and
teaching the AI program to capture and store the acceptable test result for each test point of the UUT by the test probe, in the KDB, wherein the AI program when executed by the first computer commands the test probe to test the UUT, stores the results in a test result vector, compares the test result vector with the stored acceptable test vector, and displays recommendation as which replaceable component in the UUT to be repaired or replaced.

17. The non-transitory storage medium of claim 16, wherein each index includes a test point number defined by X, Y coordinates of the UUT, and the test results describe electrical behavior of each test point.

18. The non-transitory storage medium of claim 16, wherein each test result vector includes an entry for each test point indicating whether the UUT passed or failed a respective test point, and wherein each entry in the test result vector is allocated a weight based on historical data.

19. The non-transitory storage medium of claim 16, wherein the AI program commands the test probe to test the UUT using a request data packet that contains a payload configuration for capturing test result information, wherein the test result information includes one or more of requester id, time stamp, time scale used, voltage scale used, trigger level, trigger mode, probe used and test point coordinates.

* * * * *